United States Patent [19]

Kanazawa

[11] Patent Number: 4,868,414

[45] Date of Patent: Sep. 19, 1989

[54] SCAN-PATH SELF-TESTING CIRCUIT FOR LOGIC UNITS

[75] Inventor: Takashi Kanazawa, Tokyo, Japan

[73] Assignee: NEC Corporation, Tokyo, Japan

[21] Appl. No.: 160,831

[22] Filed: Feb. 26, 1988

[30] Foreign Application Priority Data

Mar. 2, 1987 [JP] Japan .................................. 62-45282

[51] Int. Cl.$^4$ ........................ H03K 17/36; H04Q 3/00; G11C 19/00
[52] U.S. Cl. .................................... 307/244; 307/463; 328/137; 328/152; 377/77
[58] Field of Search ................ 307/244, 463; 328/119, 328/137, 152, 153; 377/76, 37, 33

[56] References Cited

U.S. PATENT DOCUMENTS 3,461,313 8/1969 Hansen ................................. 328/153
3,721,905 3/1973 Newman et al. ..................... 328/137
3,784,978 1/1974 Zola ..................................... 307/463
3,942,171 3/1976 Hararzti et al. ........................ 377/33

OTHER PUBLICATIONS

R. E. Miller, "Memory Accessing Technique", IBM Technical Disclosure Bulletin, vol. 7, No. 2, Jul. 1964.

Primary Examiner—Stanley D. Miller
Assistant Examiner—Huy Kim Mai
Attorney, Agent, or Firm—Burns, Doane, Swecker & Mathis

[57] ABSTRACT

For a plurality of logic units which are organized into scan-path groups, a scan-path self-testing circuit is provided which comprises a clock source and a plurality of gates for supplying the clock pulse to the logic units when selectively enabled. To give flexibility to group organization of the logic units, the gates are provided in a one-to-one relationship with the logic units. Bit positions of a register are associated respectively with the gates. A scan path controller selects one of the scan-path groups and writes a logic 1 into the register bit positions which are associated with the logic units of the selected scan-path group.

1 Claim, 2 Drawing Sheets

SCAN-PATH SELF-TESTING CIRCUIT FOR LOGIC UNITS

BACKGROUND OF THE INVENTION

Hitherto, scan-path self-testing circuits of integrated circuits include a plurality of gates which are selectively enabled under the control of a scan path controller to supply a clock pulse to logic units of a selected scan-path group. The clock gates are provided in a one-to-one correspondence with the scan-path groups. Because of this relationship, the circuit configuration of the gates cannot be determined until the organization of the logic units is determined and must be altered whenever the logic units are reorganized.

SUMMARY OF THE INVENTION

It is an object of the present invention to provide a scan-path self-testing circuit for logic circuit units which allows clock gates to be configured independently of the group organization of the logic units.

This object is achieved by providing clock gates in a one-to-one correspondence with and logic units which are organized into scan-path groups and connected to a scan-path controller through scan-paths associated respectively with the scan-path groups. Specificlly, the scan-path self-testing circuit of the present invention comprises a clock source for generating a clock pulse and a register having a plurality of stages having a one-to-one correspondence with the logic units, the stages being connected to the scan-path controller to receive gate selection bits therefrom. The clock gates have first input terminals connected together to the clock source, second input terminals connected respectively to the stages of the register and output terminals connected respectively to clock inputs of the logic units for supplying the clock pulse thereto when the second input terminals are at a specified logic level.

BRIEF DESCRIPTION OF THE DRAWINGS

The present invention will be described in further detail with reference to the accompanying drawings, in which.

DETAILED DESCRIPTION

Figure 1:
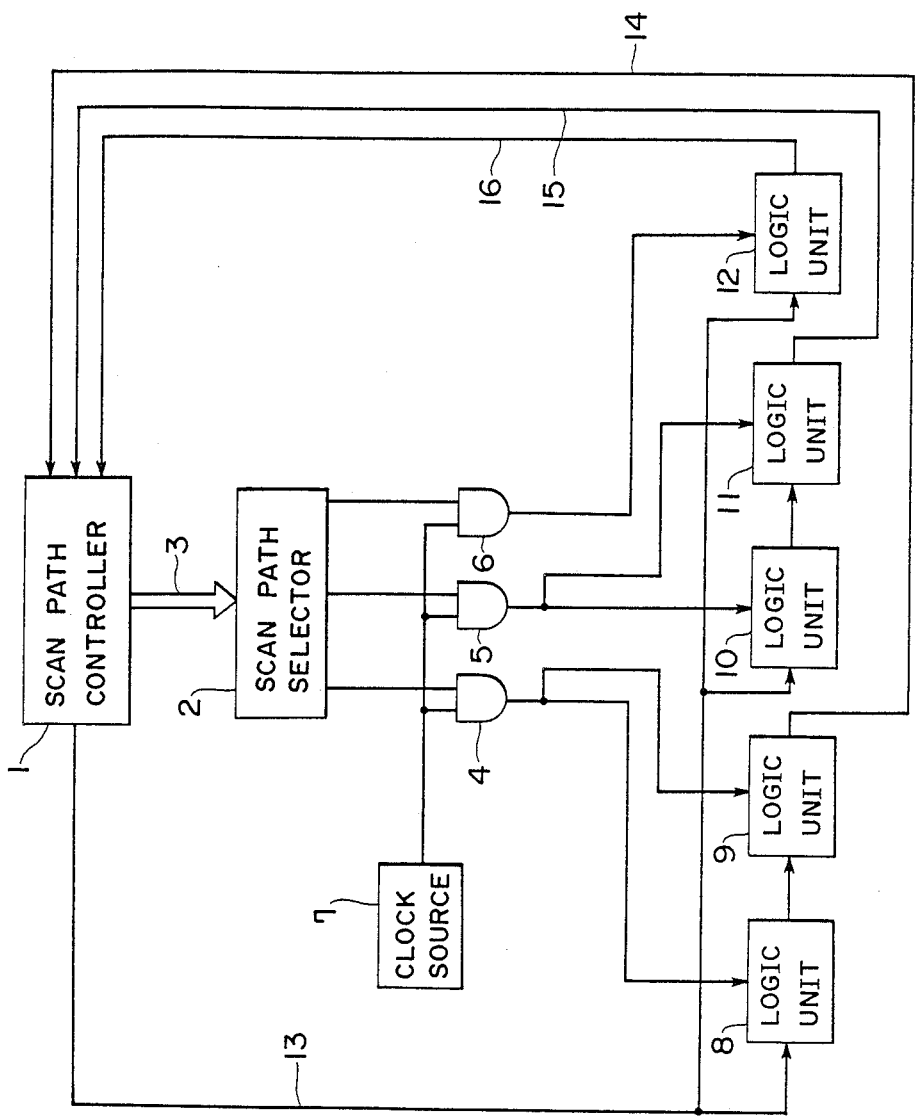
FIG. 1 is a block diagram of a prior art scan-path self-test circuit of a data processor.

Before going into the detail of the present invention, reference is first made to a FIG. 1 in which a prior art scan-path self-test circuit of a data processor is shown. The scan path self-test circuit includes a scan path controller 1 that directs a scan path selector 2 over control bus 3 to selectively enable AND gates 4, 5 and 6 to supply clock pulses from source 7 to logic units 8 through 12 each of which comprises one or more integrated circuit chips. These logic units are arranged to receive scan-in data on input line 13 from scan path controller 1 to deliver scan-out data on respective output lines 14, 15 and 16 to the controller 1, and a divided into first, second and third scan-path groups. The first scan-path group is formed by logic units 8 and 9 which are cascaded from input line 13 to output line 14. The second group is formed by logic units 10 and 11 which are cascaded from the input line 13 to output line 15, and the third group is formed by logic unit 12 whose output is connected to output line 16. The first, second and third groups of logic units are respectively associated with AND gates 4, 5 and 6 in a one-to-one correspondence, so that, when one of the AND gates is enabled by scan path selector, clock pulses are supplied to logic units of the scan-path group associated with the enabled AND gate. Since the clock control is performed on a per group basis, the connections of the AND gates to the logic units cannot be determined until the scan-path grouping of logic units is determined. One disadvantage of the prior art is that the design of the AND gates must be deferred until the scan-path grouping is determined and the AND gates must be reconfigured whenever the scan-path groups are reorganized.

Figure 2:
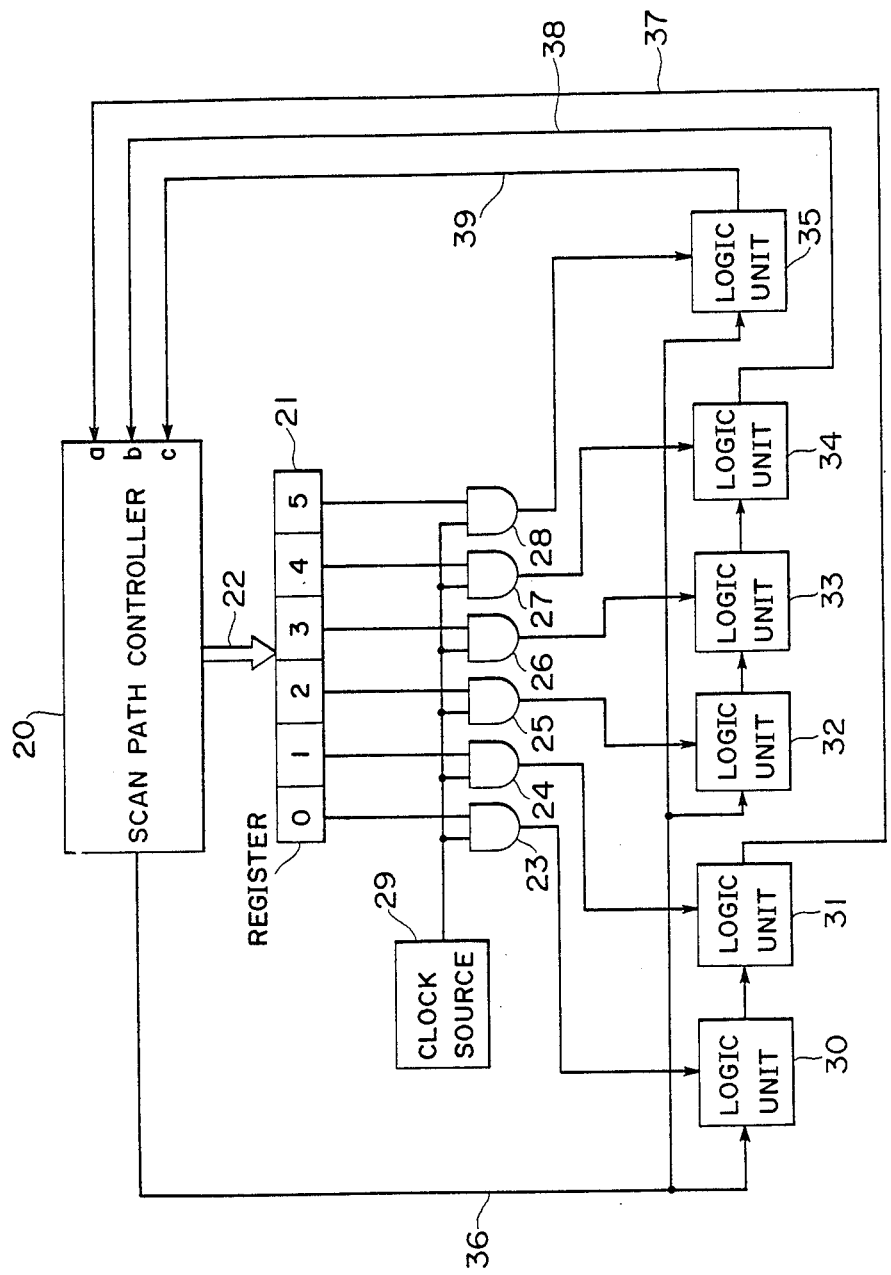
FIG. 2 is a block diagram of a scan-path self-test circuit of the present invention of a data processor.

Referring to FIG. 2, a scan-path self-test circuit of the present invention comprises a scan-path controller 20 and a register 21 having an array of bit positions identified by numerals "0" through "5" for storing logic 1 or 0 in accordance with scan path selection data supplied on bus 22 from the controller 20. The bit positions "0" through "5" of register 21 are respectively connected to first inputs of AND gates 23 through 28, second inputs of AND gates 23 through 28 being connected to clock source 29. The outputs of AND gates 23 through 28 are respectively connected to logic units 30 through 35. Thus, AND gates 23 through 28 are individually associated with logic units 30 through 35 in a one-to-one correspondence. Logic units 30 and 31 are cascaded from a scan input line 36 to a first scan output line 37 which is connected to a terminal "a" of the controller 20 to form a first scan-path group. Logic units 32, 33 and 34 are cascaded from the input line 36 to a second scan output line 38 which is connected to a terminal "b" of controller 20 to form a second scan-path group. Logic unit 35 form a third scan-path group by being cascaded between input line 36 and a third scan output line 39 which is connected to a terminal "c" of controller 20.

If the second scan-path group is to be selected, controller 20 writes logic "001110" into bit positions "0" through "5" of the register, respectively, enabling AND gates 25, 26 and 27 to clock the logic units 32, 33 and 34 of the second scan-path group. Scan-in data are applied to the second group units 32, 33 and 34 and delivered as scan-out data to the terminal "b" of controller 20, which analyzes it for diagnostic purposes.

Because of the one-to-one correspondence between logic units 30 through 35 and AND gates 23 through 28 and hence with the individual bit positions of register 21, the connections of AND gates 23 through 28 to the logic units cn be determined regardless of the group organization of the logic units. No reconfiguration of the AND gates is required when the scan-path groups are reorganized.

What is claimed is:

1. A scan-path self-testing circuit comprising:
   a scan-path controller for generating gate selection bits and having a plurality of scan-path input terminals, a scan-path output terminal, and a plurality of gate selection terminals at which said gate selection bits appear respectively;
   a plurality of groups of logic units, the logic units of each group being connected in series from said scan-path output terminal to one of said scan-path input terminals;
   a clock source for generating a clock pulse;

a register having a plurality of stages respectively connected to said gate selection terminals of said scan-path controller; and a plurality of clock gates having first input terminals connected together to said clock source, second input terminals connected respectively to said stages of said register and output terminals connected respectively to clock inputs of said logic units for supplying said clock pulse thereto in response to said gate selection bits.

* * * * *